(12) United States Patent
Kikuchi

(10) Patent No.: US 6,948,137 B2
(45) Date of Patent: Sep. 20, 2005

(54) SEMICONDUCTOR INTEGRATED DEVICE

(75) Inventor: Kazuyuki Kikuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 613 days.

(21) Appl. No.: 09/778,915

(22) Filed: Feb. 8, 2001

(65) Prior Publication Data

US 2002/0053040 A1 May 2, 2002

(30) Foreign Application Priority Data

Nov. 2, 2000 (JP) .......................... 2000-336373

(51) Int. Cl.$^7$ ...................... G06F 17/50; H03K 17/693; H01L 23/34
(52) U.S. Cl. ............... 716/1; 716/8; 716/15; 257/723
(58) Field of Search ............. 257/723; 716/1, 716/2, 8–16

(56) References Cited

U.S. PATENT DOCUMENTS

| | | | | |
|---|---|---|---|---|
| 4,479,191 A | * | 10/1984 | Nojima et al. ............. | 713/321 |
| 5,309,020 A | * | 5/1994 | Murasawa et al. .......... | 257/685 |
| 5,438,224 A | * | 8/1995 | Papageorge et al. ........ | 257/777 |
| 5,548,748 A | * | 8/1996 | Fuse ........................... | 713/401 |
| 5,734,913 A | * | 3/1998 | Iwamura et al. ........... | 713/322 |
| 5,834,843 A | * | 11/1998 | Mori et al. ................. | 257/723 |
| 5,844,263 A | * | 12/1998 | Asai et al. .................. | 257/208 |
| 6,201,434 B1 | * | 3/2001 | Kanda et al. ............... | 327/538 |

FOREIGN PATENT DOCUMENTS

| | | |
|---|---|---|
| JP | 6-140566 | 5/1994 |
| JP | 10-22458 | 1/1998 |

* cited by examiner

*Primary Examiner*—Leigh M. Garbowski
(74) *Attorney, Agent, or Firm*—Leydig, Voit & Mayer, Ltd.

(57) ABSTRACT

A semiconductor integrated device has one signal processing IC and one microcomputer unit (MCU). A few terminals of the IC are connected to the corresponding terminals of the MCU. The terminals of the IC that are connected to the corresponding terminals of the MCU are disposed near each other. Similarly, the terminals of the MCU that are connected to the corresponding terminals of the IC are disposed near each other. Moreover, the IC and the MCU are mounted, on a substrate, so that the connected terminals of the IC and MCU face each other.

8 Claims, 7 Drawing Sheets

SEMICONDUCTOR INTEGRATED DEVICE

FIELD OF THE INVENTION

The present invention in general relates to a semiconductor integrated device. More particularly, this invention relates to a semiconductor integrated device which ensures reduction in the wiring region and number of parts.

BACKGROUND OF THE INVENTION

Semiconductor integrated devices which have many functions and are small-sized have been developed in recent years. For instance, in a television receiver, a one-chip TV signal processing IC in which a TV signal processing IC is integrated with peripheral parts is being commonly used, making progress in saving space on the chassis.

FIG. 7 is a view showing a connection between a conventional TV signal processing IC and a microcomputer. A signal processing IC 71 is a semiconductor device having the ability to process TV signals. An MCU 72 is a semiconductor device which functions as a microcomputer for the control and tuning of the signal processing IC 71.

The signal processing IC 71 is provided with a voltage controlled oscillator (VCXO) (not shown) which generates standard carrier waves for processing color signals therein. The voltage controlled oscillator is connected to a crystal vibrator 3 via a crystal vibrator connecting terminal 4. Also, the signal processing IC 71 comprises OSD input terminals 5 to 8, bus control line input terminals 9 and 10, a pulse output terminal 11 for horizontal driving, a pulse output terminal 12 for vertical driving, those for determining position of OSD, and a reset pulse output terminal 13 for resetting an MCU 2. A vibrator 14 is a generator of a system clock of the MCU 72 and is connected to the MCU 72 via a system clock input terminal 15. The MCU 72 comprises bus control line output terminals 16 and 17, a pulse input terminal 18 for horizontal driving, a pulse input terminal 19 for vertical driving, OSD signal output terminals 20 to 23 and a reset pulse input terminal 24.

The signal processing IC 71 and the MCU 72 are mounted on a substrate and each terminal of the signal processing IC 71 and the MCU 72 is connected by wiring printed on the substrate.

Incidentally, the peripheral parts of terminals which are not pertinent to the connection between the signal processing IC 71 and the MCU 72 are omitted.

However, in the conventional television receiver, terminals which connect the signal processing IC with the MCU are scattered on each side, bringing about complicated connections and making the wiring region of a printed substrate large, giving rise to the problem of a larger packaging area of the substrate.

Also, the signal processing IC requires the crystal oscillator for processing color signals and the MCU requires the oscillator for a system clock, posing the problem that parts having similar functions are required and the number of parts is increased.

Besides television receivers, in all semiconductor integrated devices including a plurality of semiconductor devices, each semiconductor device is provided with connecting terminals without considering positional relationships with other semiconductor devices. Accordingly, there is a problem that the wiring region of a substrate is increased and therefore the packaging area of the substrate is increased. Further, a separate oscillator is provided for each semiconductor device. Accordingly, the number of parts and, therefore, the packaging area increases.

SUMMARY OF THE INVENTION

It is an object of the present invention to provide an inexpensive semiconductor integrated device in which it is possible to reduce the wiring region on the substrate and also reduce the number of parts and thereby decrease the packaging area.

According to the semiconductor integrated device of one aspect of this invention, the group of terminals of the first semiconductor device that are connected to the terminals of the second semiconductor device, or the group of terminals of the second semiconductor device that are connected to the terminals of the first semiconductor device, the group of terminals of the first and second semiconductor device that are connected to each other are placed together.

According to the semiconductor integrated device of another aspect of this invention, the group of terminals of the first semiconductor device that are connected to the terminals of the second semiconductor device, or the group of terminals of the second semiconductor device that are connected to the terminals of the first semiconductor device, the group of terminals of the first and second semiconductor device that are connected to each other are placed opposite to each other on the substrate of the semiconductor integrated device, with a through-hole in between them.

Other objects and features of this invention will become apparent from the following description with reference to the accompanying drawings.

DESCRIPTION OF THE PREFERRED EMBODIMENTS

Preferred embodiments of the semiconductor integrated device according to the present invention will be hereinafter explained in detail with reference to the attached drawings.

Figure 1:
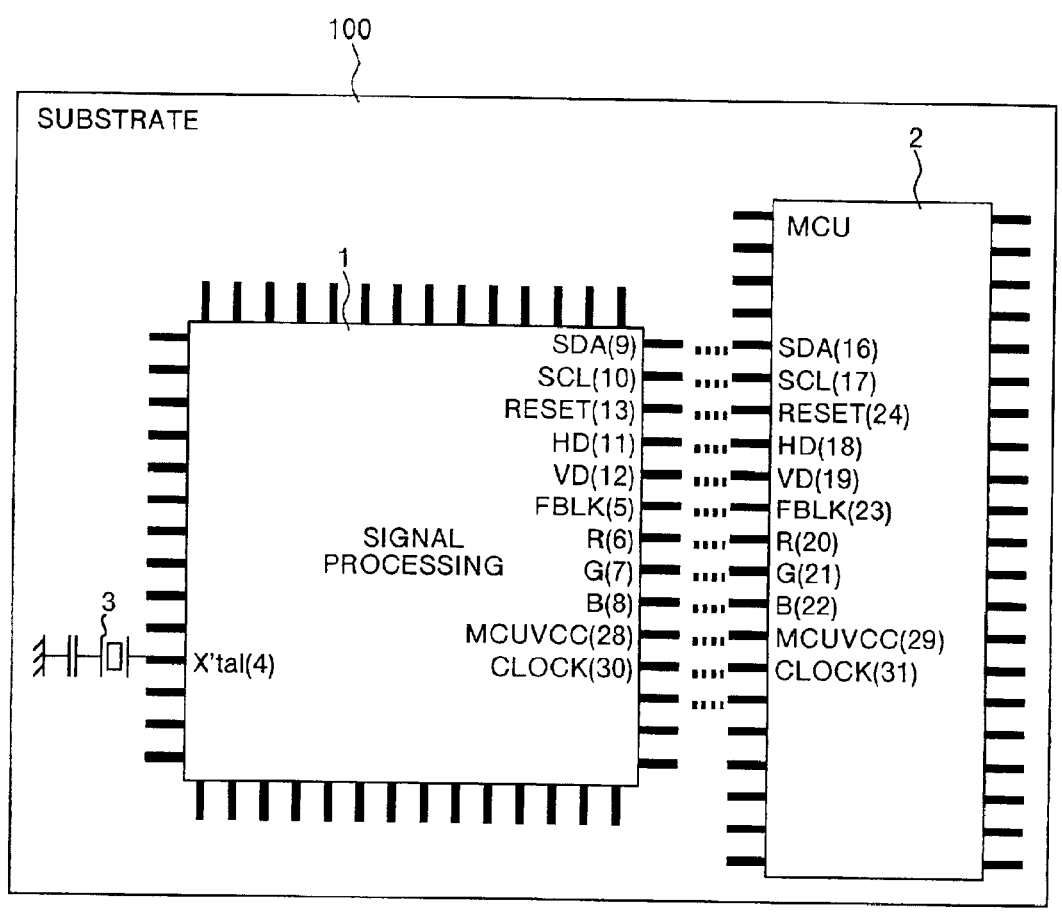
FIG. 1 is a view showing the structure of a semiconductor integrated device which is an embodiment of the present invention.

FIG. 1 is a view showing the structure of a semiconductor integrated device of a first embodiment of the present invention. The semiconductor integrated device shown in FIG. 1 is a television receiver and provided with a signal processing IC 1 and an MCU 2. The signal processing IC 1 is a semiconductor device having the ability to process TV signals. Also, the MCU 2 is a semiconductor device which functions as a microcomputer working for the control and tuning of the signal processing IC 1. The signal processing IC 1 and the MCU 2 are disposed on a substrate 100 and are connected to each other via a wiring printed on the substrate 100.

The signal processing IC 1 is connected to a crystal vibrator 3 via a crystal vibrator connecting terminal 4. Also, the signal processing IC 1 is provided with OSD input terminals 5 to 8, bus control line input terminals 9 and 10, a pulse output terminal 11 for horizontal driving which determines the position of the OSD, a pulse output terminal 12 for vertical driving and a reset pulse output terminal 13 for resetting the MCU 2. The signal processing IC 1 is further provided with a power source voltage input terminal 28 receiving power source voltage from the MCU 2 and a clock output terminal 30 supplying a system clock to the MCU 2.

The MCU 2 is provided with bus control line output terminals 16 and 17, a pulse input terminal 18 for horizontal driving, a pulse input terminal 19 for vertical driving, OSD signal output terminals 20 to 23 and a reset pulse input terminal 24. The MCU 2 is further provided with a power source voltage output terminal 29 supplying power source voltage to the signal processing IC 1 and a clock input terminal 31 receiving a system clock from the signal processing IC 1.

The OSD input terminals 5 to 8 of the signal processing IC 1 are connected to the OSD signal output terminals 20 to 23 of the MCU 2 respectively. Similarly, the bus control line input terminals 9 and 10 are connected to the bus control line output terminals 16 and 17, the pulse output terminal 11 for horizontal driving is connected to the pulse input terminal 18 for horizontal driving, the pulse output terminal 12 for vertical driving is connected to the pulse input terminal 19 for vertical driving and the reset pulse output terminal 13 is connected to the reset pulse input terminal 24. Further, the power source voltage input terminal 28 is connected to the power source voltage output terminal 29 and the clock output terminal 30 is connected to the clock input terminal 31.

Also, the terminals of the signal processing IC 1 including the OSD input terminals 5 to 8, the bus control line input terminals 9 and 10, the pulse output terminals 11 for horizontal driving, the pulse output terminal 12 for vertical driving, the reset pulse output terminal 13, the power source voltage input terminal 28 and the clock output terminal 30 are disposed collectively on the same side. Similarly, the terminals of the MCU 2 including the pulse control line output terminals 16 and 17, the pulse input terminal 18 for horizontal driving, the pulse input terminal 19 for vertical driving, OSD signal output terminals 20 to 23, the reset pulse input terminal 24, the power source voltage output terminal 29 and the clock input terminal 31 are disposed collectively on the same side.

Also, the order of the position of each terminal collected on one side of the signal processing IC 1 corresponds to the order of each terminal collected on one side of the MCU 2. Also, the signal processing IC 1 and the MCU 2 are disposed on the substrate in a manner that the sides on which the terminals are collectively disposed face each other.

Figure 2:
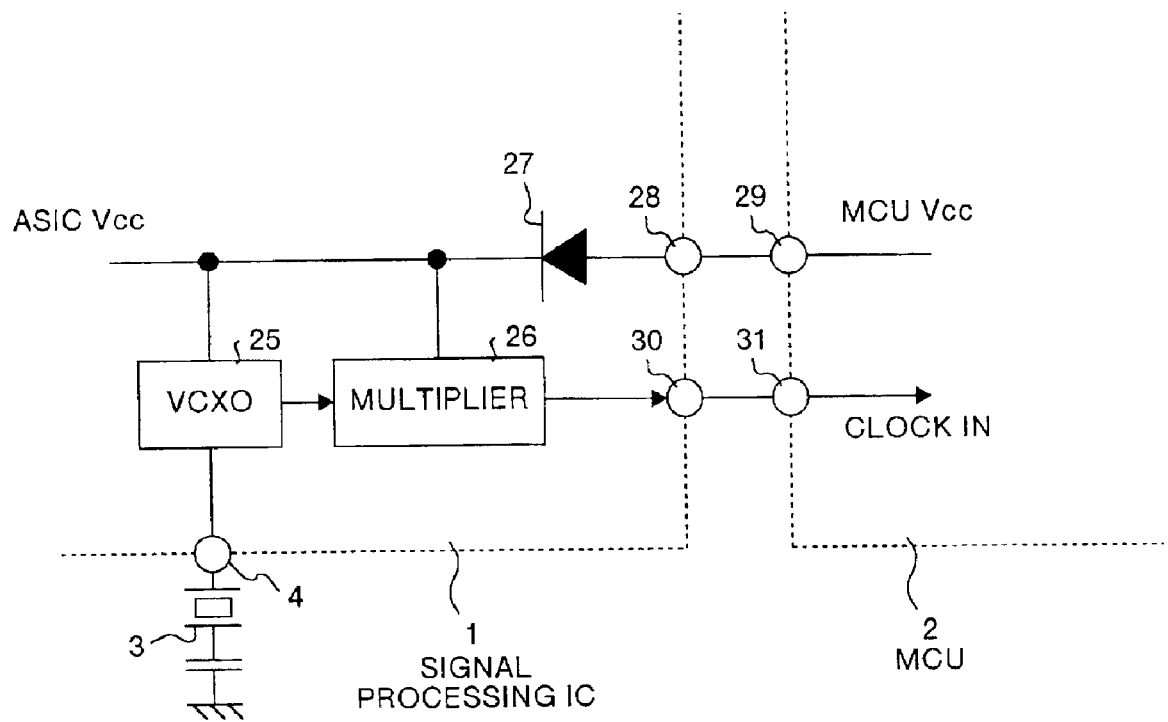
FIG. 2 is a view showing the function of each of a crystal oscillator, a signal processing IC, and an MCU shown in FIG. 1.

Here, the function of each of the crystal vibrator 3, signal processing IC 1 and MCU 2 will be explained with reference to FIG. 2. The crystal vibrator 3 is connected to a voltage controlled oscillator (VCXO) 25 in the signal processing IC 1 via the crystal vibrator connecting terminal 4. The voltage controlled oscillator 25 creates a standard carrier wave for color signal processing by using the crystal vibrator 3. A multiplier 26 is connected to the voltage controlled oscillator 25, multiplies the output of the voltage controlled oscillator 25 to turn the output to the frequency of the system clock of the MCU 2 and outputs the signal to the outside of the signal processing IC 1 via the clock output terminal 30. The MCU 2 receives the clock signal output from the clock output terminal 30 via the clock input terminal 31 and uses the signal as the system clock of the MCU 2.

Power source voltage is supplied from the inside of the signal processing IC 1 to the voltage controlled oscillator 25 and the multiplier 26. Also, the MCU 2 is provided with the power source voltage output terminal 29 which outputs power source voltage from the MCU 2. The power source voltage input terminal 28 supplies the power source voltage output from the power source voltage output terminal 29 to the voltage controlled oscillator 25 and the multiplier 26 via a diode 27.

When power source is supplied to both of the signal processing IC 1 and MCU 2, the diode 27 cuts off the power source voltage output from the power source voltage input terminal 28 and the voltage controlled oscillator 25 and the multiplier 26 are operated by making use of the power source of the signal processing IC 1.

When no power source is supplied to the signal processing IC 1 but power source is supplied to the MCU 2, the diode 27 allows power source voltage from the power source voltage input terminal 28 to pass and the voltage controlled oscillator 25 and the multiplier 26 are operated by making use of the power source supplied from the power source voltage input terminal 28.

Accordingly, the power source voltage oscillator 25 makes use of power source from either one of the signal processing IC 1 and the MCU 2 to oscillate and supplies a system clock to the MCU 2 via the multiplier 26.

In this first embodiment, a wiring on the substrate can be made short and simple with decreased crossings because terminals connected to the MCU 2 are collected on one side, disposed corresponding to the order of the position of each terminal of the MCU 2 and arranged on the substrate such that each terminal of the signal processing IC 1 faces each terminal of the MCU 2. It is therefore possible to decrease the wiring region of the substrate.

In, particularly, many products such as a television receiver, like the case of the signal processing IC and the MCU, a connection with a specific semiconductor device can be expected beforehand. It is therefore possible to set the location of the terminals efficiently and the wiring region can be reduced significantly.

Also, the vibrator can be communized by supplying power source to a part of the signal processing IC 1 from the MCU 2 and by utilizing the crystal vibrator, which the signal processing IC 1 possesses and is used to produce standard carrier waves for color signal processing, as the vibrator for the system clock of MCU 2. For this reason, the number of parts and the packaging area can be decreased, whereby an inexpensive and small-sized semiconductor integrated device can be obtained.

Particularly, in many products such as a television receiver, these products can be on standby status but only a main power source is on. Even when no power source is supplied to a semiconductor device to which a vibrator is directly connected during standby status, power source is supplied from a semiconductor device to which power source is supplied during standby status to operate the vibrator, whereby a system clock can be obtained.

Incidentally, when the number of terminals connected from the signal processing IC 1 to the MCU 2 exceed the number of the terminals which can be disposed on one side of the signal processing IC, both sides adjacent to the above side may be further used.

Figure 3:
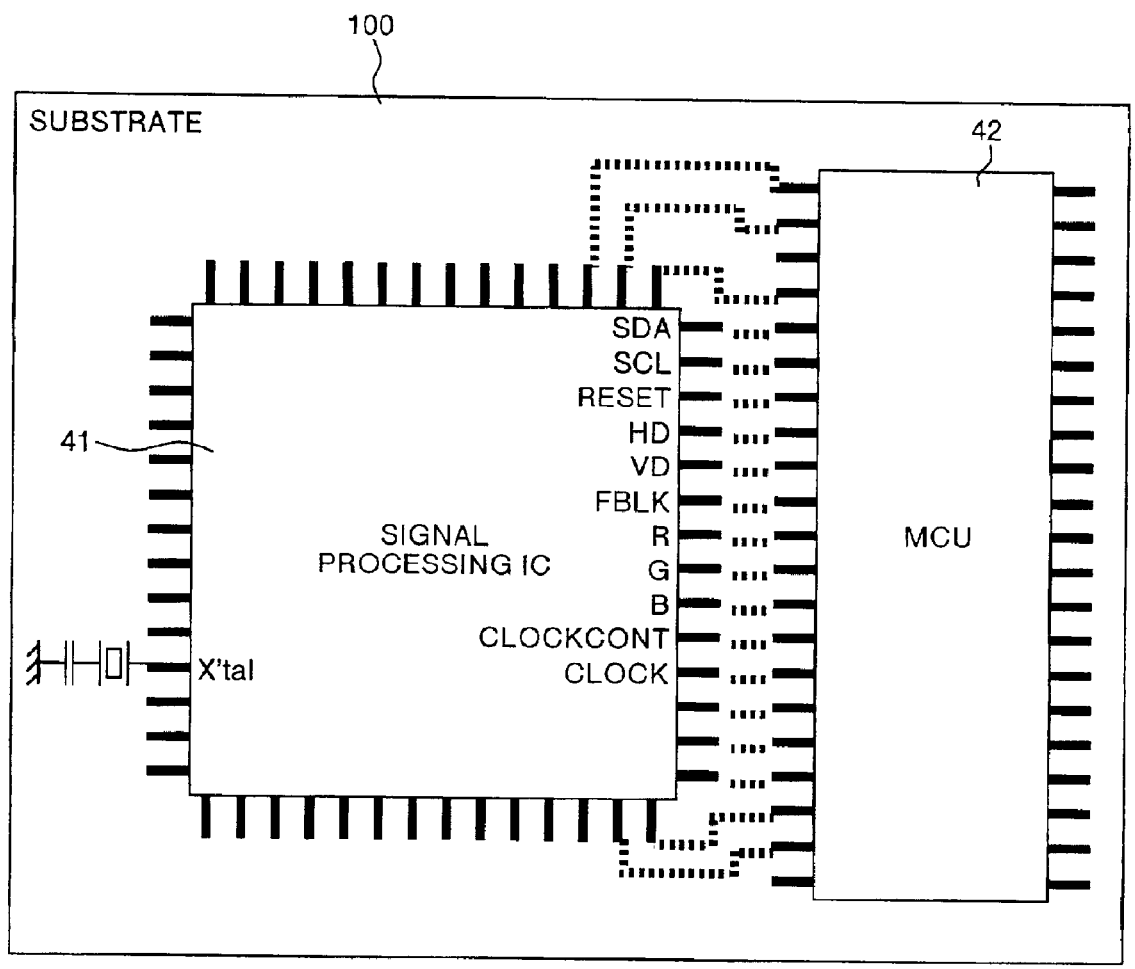
FIG. 3 is a view showing a structure when the number of terminals connected from a signal processing IC to an MCU exceeds the number of the terminals which can be disposed on one side.

FIG. 3 is a view showing the structure when the number of terminals connected from a signal processing IC 41 to an MCU 42 exceed the number of the terminals which can be disposed on one side of the signal processing IC. In this case, terminals are collected in one side closest to the MCU 42 and other terminals are disposed close to the MCU 42 on two sides connecting to the one side. If this structure is used, a wiring is efficiently arranged on the substrate and the wiring region can be outstandingly decreased even when the number of terminals to be connected is larger than the number of the terminals which can be disposed in one side.

Among the terminals of the signal processing IC, terminals to be collectively disposed are not limited to those exemplified in this embodiment and this structure may be used for any terminal to be connected to the MCU.

The order of the position of each terminal is not limited to the order explained in the first embodiment but a desired order may be used.

Further, it is not always required that the respective orders of a terminal positioning in the signal processing IC and MCU coincide with each other completely.

Incidentally, although in this first embodiment, explanations concerning the signal processing IC and MCU of a television receiver are furnished, the application of the present invention is not limited to this case but the present invention may be used for any semiconductor integrated device insofar as the semiconductor integrated device has a semiconductor device which is connected by a plurality of connecting terminals.

Also, even semiconductor devices having any package form such as a DIP (Dual Inline Package), SOP (Small Outline Package) and QFP (Quad Flat Package) do not limit the utilization of the present invention.

Figure 4:
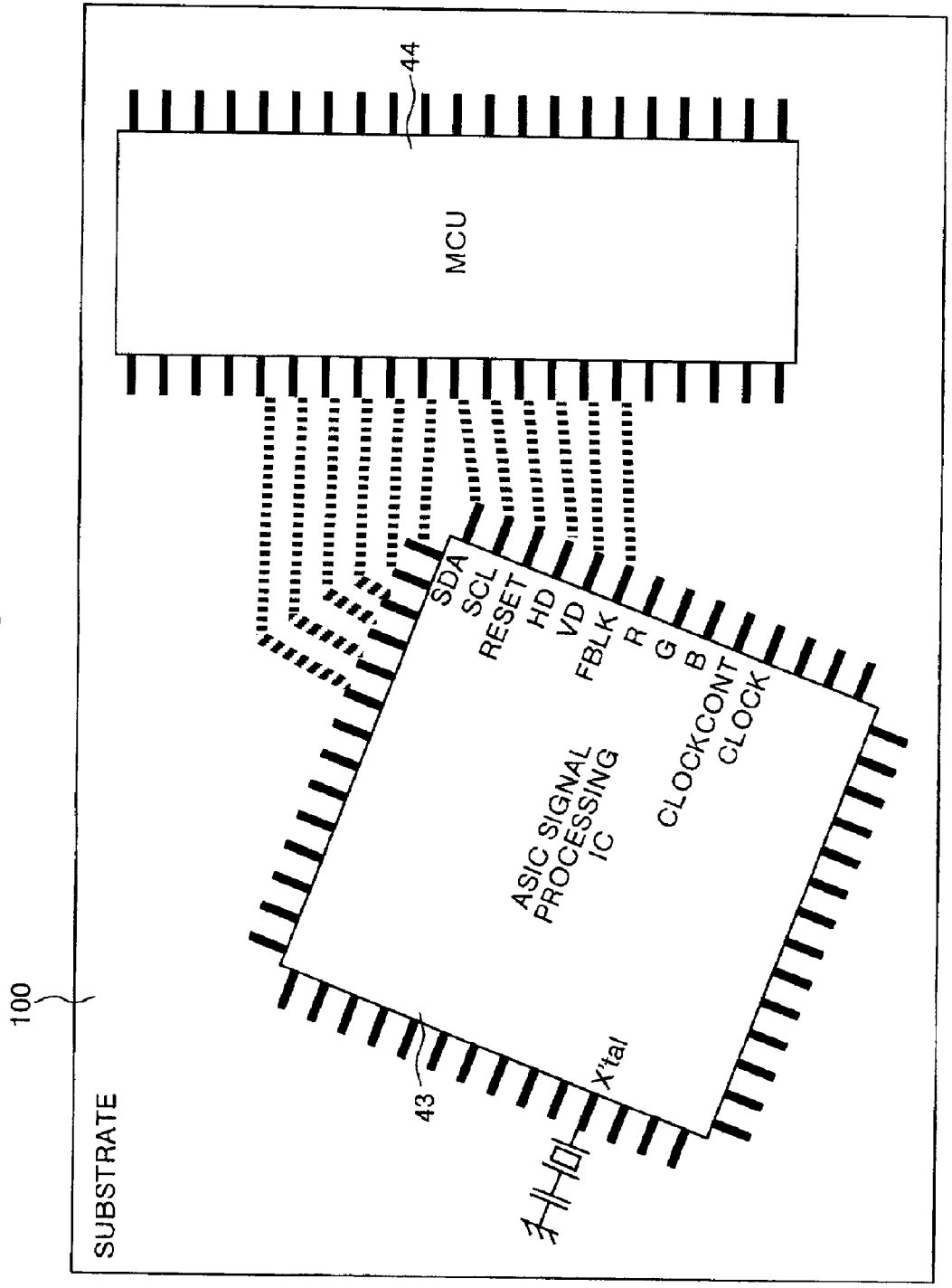
FIG. 4 is a view showing a structure when terminals are collected on one corner of a semiconductor device.

A second embodiment of the present invention will be explained. FIG. 4 is a view showing the structure of a semiconductor integrated device which is the second embodiment of the present invention. In this second embodiment, the semiconductor integrated device is provided with a signal processing IC 43 and an MCU 44.

The signal processing IC 43 corresponds to the signal processing IC used in the first embodiment, has the function to process TV signals and is provided with the same terminals as the signal processing IC 1. Also, the MCU 44 corresponds to the MCU 2 in the first embodiment, functions as a microcomputer working for the control and tuning of the signal processing IC 43 and is provided with the same terminals as the MCU 2.

The signal processing IC 43 and the MCU 44 are disposed on a substrate 100 and connected to each other through a wiring printed on the substrate 100. Also, terminals which the signal processing IC 43 possesses, specifically, OSD input terminals 5 to 8, bus control line input terminals 9 and 10, a pulse output terminal 11 for horizontal driving, a pulse output terminal 12 for vertical driving, a reset pulse output terminal 13, a power source voltage input terminal 28 and a clock output terminal 30 are disposed collectively on the both sides forming a corner closest to the MCU 44 on the side close to the MCU 44.

Moreover, the order of the position of each collected terminal of the signal processing IC 43 corresponds to the order of the position of each terminal of the MCU 44.

In this second embodiment, the signal processing IC 43 has the structure in which terminals connected to the MCU 44 are disposed not only collectively on the both sides forming a corner closest to the MCU 44 on the side close to the MCU 44 but also corresponding to the order of the position of each terminal of the MCU 44. Therefore, a wiring on the substrate can be made short and simple with decreased crossings in this case as well as the case where the signal processing IC and the MCU are disposed on the substrate in parallel as to the positional relation between the both. It is therefore possible to decrease the wiring region of the substrate.

Among the terminals of the signal processing IC, terminals to be collectively disposed are not limited to those exemplified in this embodiment and this structure may be used for any terminal to be connected to the MCU.

Also, it is not always required that the respective orders of a terminal positioning in the signal processing IC and MCU coincide with each other completely.

Incidentally, although in this second embodiment, explanations concerning the signal processing IC and MCU of a television receiver are furnished, the application of the present invention is not limited to this case but the present invention may be used for any semiconductor integrated device insofar as the semiconductor integrated device has a semiconductor device which is connected by a plurality of connecting terminals.

Figure 5:
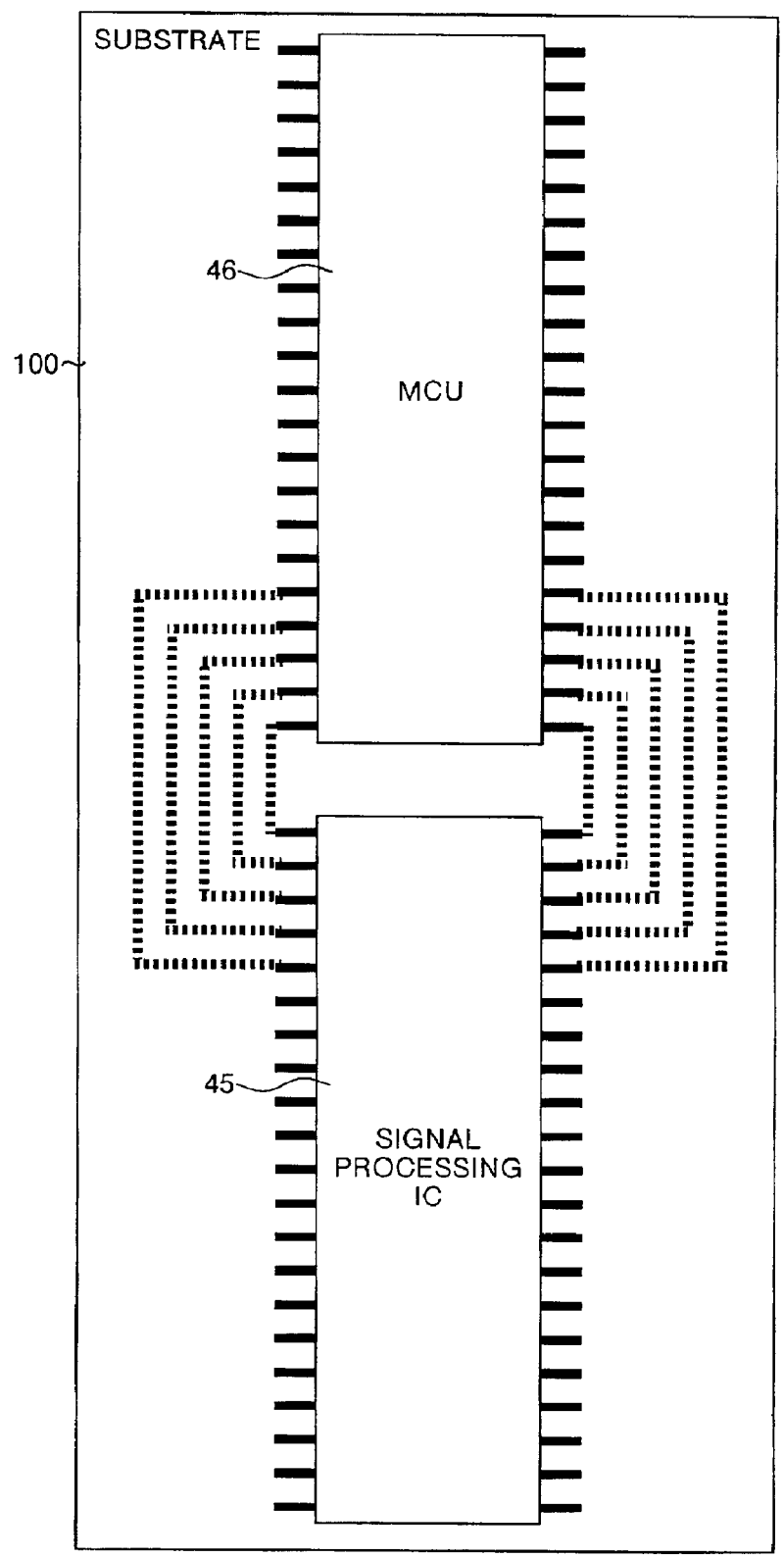
FIG. 5 is a view showing a structure when two semiconductor devices to be connected to each other have a package form in which respective terminals are provided on only two sides facing each other.

A third embodiment of the present invention will be explained. FIG. 5 is a view showing the structure of a semiconductor integrated device which is the third embodiment of the present invention. In this third embodiment, the semiconductor integrated device is provided with a signal processing IC 45 and an MCU 46. The package form of each of the signal processing IC 45 and the MCU 46 is a DIP and is provided with terminals on only two sides facing each other. Also, the signal processing IC 45 and the MCU 46 are disposed on a substrate 100 in a manner that the respective sides having no terminal face each other and are connected through a wiring printed on the substrate 100.

The signal processing IC 45 corresponds to the signal processing IC 1 used in the first embodiment, has the ability to process TV signals and is provided with the same terminals as the signal processing IC 1. Also, the MCU 46 corresponds to the MCU 2 used in the first embodiment, functions as a microcomputer working for the control and tuning of the signal processing IC 45 and is provided with the same terminals as the MCU 2.

Terminals which the signal processing IC 45 possesses, specifically, OSD input terminals 5 to 8, bus control line input terminals 9 and 10, a pulse output terminal 11 for horizontal driving, a pulse output terminal 12 for vertical driving, a reset pulse output terminal 13, a power source voltage input terminal 28 and a clock output terminal 30 are disposed collectively on each side having terminals on the side close to the MCU 46.

Similarly, terminals which the MCU 46 possesses, specifically, bus control line output terminals 16 and 17, a pulse input terminal 18 for horizontal driving, a pulse input terminal 19 for vertical driving, OSD signal output terminals 20 to 23, a reset pulse input terminal 24, a power source voltage output terminal 29 and a clock input terminal 31 are disposed collectively on each side having terminals on the side close to the signal processing IC 45.

Moreover, the order of the position of each collected terminal of the signal processing IC 45 corresponds to the order of the position of each collected terminal of the MCU 46.

In this third embodiment, the signal processing IC 45 has the structure in which terminals connected to MCU 46 are disposed not only collectively on the side close to the MCU 46 having terminals but also corresponding to the order of the position of each terminal of the MCU 44. Therefore, a wiring on the substrate can be made short and simple with decreased crossings even if the signal processing IC and the MCU respectively have a package form, such as a DIP and SOP, having terminals on only two sides facing each other. It is therefore possible to decrease the wiring region of the substrate.

Among the terminals of the signal processing IC, terminals to be collectively disposed are not limited to those exemplified in this embodiment and this structure may be used for any terminal to be connected to the MCU.

The order of the position of each terminal is not limited to the order explained in this embodiment but a desired order may be used.

Also, it is not always required that the respective orders of the signal processing IC and MCU coincide with each other completely.

Incidentally, although in this embodiment, explanations concerning the signal processing IC and MCU of a television receiver are furnished, the application of the present invention is not limited to this case but the present invention may be used for any semiconductor integrated device insofar as the semiconductor integrated device has a semiconductor device which is connected by a plurality of connecting terminals.

Figure 6:
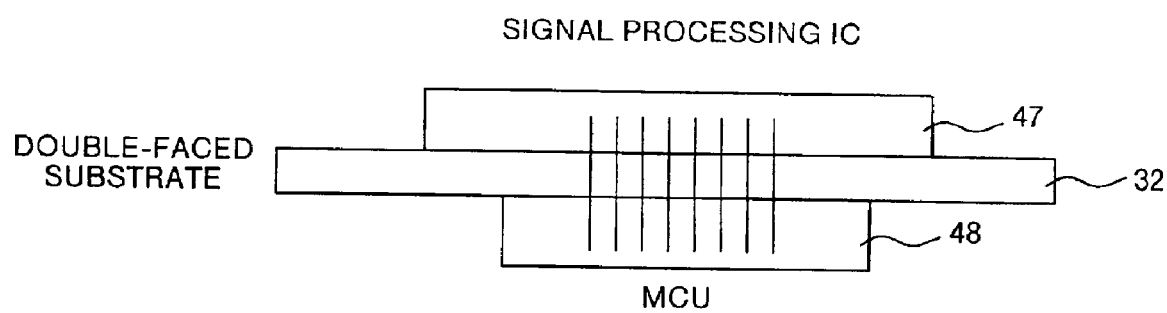
FIG. 6 is a view showing a structure when a semiconductor device is arranged by making use of a double-faced substrate.
Figure 7:
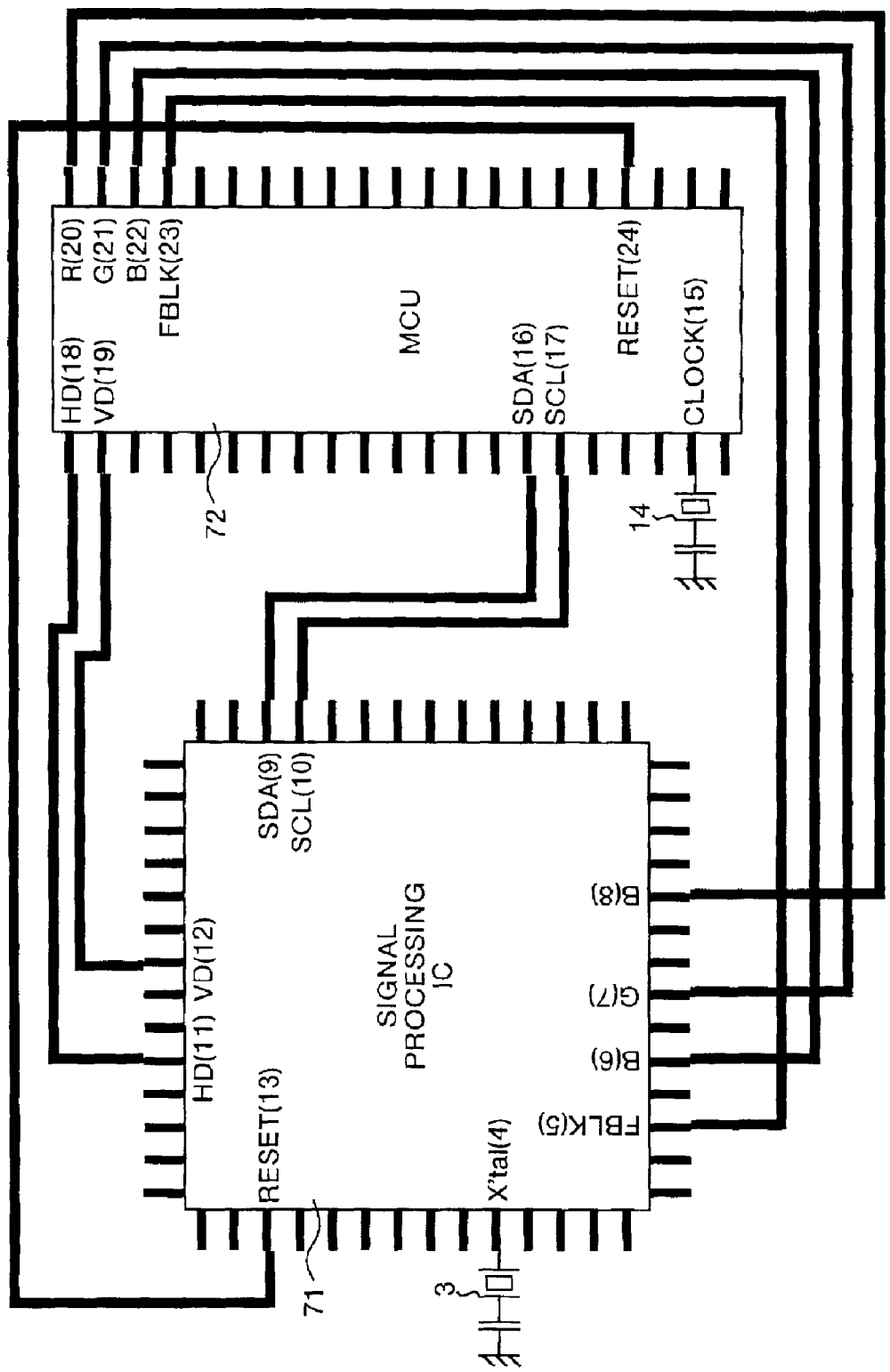
FIG. 7 is a view showing the connection between a conventional TV signal processing IC and microcomputer.

A forth embodiment of the present invention will be explained. FIG. 6 is a view showing the structure of a semiconductor integrated device which is the forth embodiment of the present invention. In this forth embodiment, the semiconductor integrated device is provided with a signal processing IC 47 and an MCU 48.

The signal processing IC 47 corresponds to the signal processing IC 1 used in the first embodiment, has the function to process TV signals and is provided with the same terminals as the signal processing IC 1. Also, the MCU 48 corresponds to the MCU 2 used in the first embodiment, functions as a microcomputer working for the control and tuning of the signal processing IC 47 and is provided with the same terminals as the MCU 2.

The signal processing IC 47 is disposed on a double-faced substrate 32 and the MCU 48 is disposed on the backface of the double-faced substrate 32 which is opposite to the surface on which the signal processing IC 47 is disposed. Moreover, the signal processing IC 47 and the MCU 48 are connected to each other through a through-hole formed in the double-faced substrate 32.

Also, terminals which the signal processing IC 47 possesses, specifically, OSD input terminals 5 to 8, bus control line input terminals 9 and 10, a pulse output terminal 11 for horizontal driving, a pulse output terminal 12 for vertical driving, a reset pulse output terminal 13, a power source voltage input terminal 28 and a clock output terminal 30 are disposed collectively on the same side. Similarly, terminals which the MCU 48 possesses, specifically, bus control line output terminals 16 and 17, a pulse input terminal 18 for horizontal driving, a pulse input terminal 19 for vertical driving, OSD signal input terminals 20 to 23, a reset pulse input terminal 24, a power source voltage output terminal 29 and a clock input terminal 31 are disposed collectively on the same side.

Moreover, the order of the position of each terminal collected on one side of the signal processing IC 47 corresponds to the order of the position of each terminal collected on one side of the MCU 46. Also, the signal processing IC 47 and the MCU 48 are disposed sandwiching the double-faced substrate 32 such that the collected respective terminals face each other.

In this forth embodiment, the signal processing IC 47 has the structure in which terminals connected to MCU 48 are disposed not only collectively on one side but also corresponding to the order of the position of each terminal of the MCU 48 and the terminals of the signal processing IC 47 and the terminals of the MCU 48 are disposed sandwiching the double-faced substrate 32 in such a manner as to face each other. Therefore, a wiring on the substrate can be made short and simple with decreased crossings. It is therefore possible to decrease the wiring region of the substrate.

Among the terminals of the signal processing IC, terminals to be collectively disposed are not limited to those exemplified in this embodiment and this structure may be used for any terminal to be connected to the MCU.

The order of the position of each terminal is not limited to the order explained in this embodiment but a desired order may be used.

Also, it is not always required that the respective orders of a terminal positioning in the signal processing IC and MCU coincide with each other completely.

Incidentally, although in this embodiment, explanations concerning the signal processing IC and MCU of a television receiver are furnished, the application of the present invention is not limited to this case but the present invention may be used for any semiconductor integrated device insofar as the semiconductor integrated device has a semiconductor device which is connected by a plurality of connecting terminals.

Also, even semiconductor devices having any package form such as an SOP, DIP and QFP do not limit the utilization of the present invention.

As is explained above, according to one aspect of this invention, the group of terminals of the first semiconductor device that are connected to the terminals of the second semiconductor device, or the group of terminals of the second semiconductor device that are connected to the terminals of the first semiconductor device, the group of terminals of the first and second semiconductor device that are connected to each other are placed together. Therefore, the wiring region of the substrate is decreased, enabling the preparation of an inexpensive semiconductor integrated device having a small packaging area.

Further, the terminals which connect the first semiconductor device with the second semiconductor device are arranged opposite to each other on the substrate of the semiconductor integrated device. Therefore, the wiring region of the substrate is decreased, enabling the preparation of an inexpensive semiconductor integrated device having a small packaging area.

According to another aspect of this invention, the group of terminals of the first semiconductor device that are connected to the terminals of the second semiconductor device, or the group of terminals of the second semiconductor device that are connected to the terminals of the first semiconductor device, the group of terminals of the first and second semiconductor device that are connected to each other are placed opposite to each other on the substrate of the semiconductor integrated device, with a through-hole in between them. Therefore, the wiring region of the substrate is decreased, enabling the preparation of an inexpensive semiconductor integrated device having a small packaging area.

Further, the connecting terminals which connect the first semiconductor device with the second semiconductor device are disposed collectively on one side of the semiconductor device. Therefore, the wiring region of the substrate is outstandingly decreased, enabling the preparation of an inexpensive semiconductor integrated device having a small packaging area.

Further, the connecting terminals which connect the first semiconductor device with the second semiconductor device are disposed collectively on one side of the semiconductor device or on a side adjacent to the one side. Therefore, the wiring region of the substrate is decreased, enabling the preparation of an inexpensive semiconductor integrated device having a small packaging area.

Further, the connecting terminals which connect the first semiconductor device with the second semiconductor device are arranged in series such that these connecting terminals are related by the prescribed order to each other. Therefore, the wiring region of the substrate is decreased, enabling the preparation of an inexpensive semiconductor integrated device having a small packaging area.

Further, the first semiconductor device and the second semiconductor device are arranged such that the respective short side parts of these semiconductor devices are opposite to each other and the respective connecting terminals which connect the first semiconductor device with the second semiconductor are arranged in prescribed order on the long side part of each semiconductor device in the vicinity of the short side parts which are made to face each other. Therefore, the wiring region of the substrate is decreased, enabling the preparation of an inexpensive semiconductor integrated device having a small packaging area.

Further, the first semiconductor device receives the supply of power source from the second semiconductor device to allow the oscillating unit and multiplying unit to work, multiplies periodic signals generated by the oscillating unit and inputs the signals as a system clock to the second semiconductor device. Therefore, the number of parts is decreased and the wiring region of the substrate is decreased, enabling the preparation of an inexpensive semiconductor integrated device having a small packaging area.

Further, the oscillating unit and multiplying unit of the first semiconductor device work by using the power source of the first semiconductor device when power source is supplied to the first semiconductor device and by using the power source supplied from the second semiconductor device when power source is not supplied to the first semiconductor device. Therefore, the number of parts is decreased and the wiring region of the substrate is decreased, enabling the preparation of an inexpensive semiconductor integrated device having a small packaging area.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device structure comprising:
    a substrate;
    a first packaged integrated circuit including a package and having a plurality of terminals extending outwardly from a periphery of the package, the first packaged integrated circuit being mounted on the substrate; and
    a second packaged integrated circuit including a package and having a plurality of terminals extending outwardly from a periphery of the package, the second packaged integrated circuit being mounted on the substrate, wherein
        at least some of the terminals of the first packaged integrated circuit are connected to corresponding terminals of the second integrated circuit,
        the terminals of the first and second packaged integrated circuits that are connected to each other are arranged facing each other on the substrate,
        the packages of the first and second packaged integrated circuits each have a plurality of sides from which the respective terminals project,
        the terminals of the first and second packaged integrated circuits that are connected to each other are all located on first and second sides of the first packaged integrated circuit and on a first side of the second packaged integrated circuit, and
        the first and second sides of the first packaged integrated circuit face the first side of the second packaged integrated circuit.

2. The semiconductor device structure according to claim 1, wherein the packages of the first and second integrated circuits are rectangular and a corner at the first and second sides of the package of the first packaged integrated circuit faces the first side of the second packaged integrated circuit.

3. The semiconductor device structure according to claim 1, wherein
    the terminals of the first packaged integrated circuit that are connected to terminals of the second packaged integrated circuit are arranged in a group, in series,
    the terminals of the second packaged integrated circuit that are connected to terminals of the first packaged integrated circuit are arranged in a group, in series, and
    the terminals of the first packaged integrated circuit are arranged in the same order as the terminals of the second packaged integrated circuit.

4. The semiconductor device structure according to claim 1, wherein
    the first packaged integrated circuit comprises:
        a power source input terminal for receiving a power source voltage from the second packaged integrated circuit,
        an oscillating unit connected to the power source input terminal and generating an AC signal having a frequency, and
        a multiplying unit which changes the frequency of the signal which the oscillating unit generates to produce a multiplied signal, and
    an output terminal which outputs the multiplied signal; and the second packaged integrated circuit comprises:
        a power source output terminal which supplies the power source voltage to the power source input terminal of the first packaged integrated circuit, and
        a signal input terminal for receiving the signal from the output terminal.

5. The semiconductor device structure according to claim 4, wherein the first packaged integrated circuit further comprises:
    a power source voltage supplying unit which supplies power to the oscillating unit; and a power source switching unit which supplies power from the power source voltage supplying unit to the oscillating unit and to the multiplying unit when the power source voltage supplying unit supplies power, and which supplies power from the power source input terminal to the oscillating unit and the multiplying unit when the power source voltage supplying unit does not supply power.

6. The semiconductor device structure according to claim 1, wherein the first and the second packaged integrated circuits are mounted on the same side of the substrate.

7. A semiconductor device structure comprising:

a substrate;

a first packaged integrated circuit including a rectangular package having a pair of longer sides and a pair of shorter sides and having a plurality of terminals extending outwardly from the longer sides of the package, the first packaged integrated circuit being mounted on the substrate; and a second packaged integrated circuit including a rectangular package having a pair of longer sides and a pair of shorter sides and having a plurality of terminals extending outwardly from the longer sides of the package, the second packaged integrated circuit being mounted on the substrate, wherein at least some of the terminals of the first packaged integrated circuit, as a first group of terminals, are connected to corresponding terminals of a second group of terminals of the second integrated circuit, shorter sides of each of the first and second packaged integrated circuits face each other, the first group of terminals and the second group of terminals are arranged in series, the terminals of the first and second groups are arranged in the same order on the packages of the first and second packaged integrated circuits, and the terminals of the first and second groups closest to the shorter sides of the packages of the first and second packaged integrated circuits that face each other are connected to each other, the first packaged integrated circuit comprises:

a power source input terminal for receiving a power source voltage from the second packaged integrated circuit, an oscillating unit connected to the power source input terminal and generating an AC signal having a frequency, and a multiplying unit which changes the frequency of the signal which the oscillating unit generates to produce a multiplied signal, and an output terminal which outputs the multiplied signal; and the second packaged integrated circuit comprises:

a power source output terminal which supplies the power source voltage to the power source input terminal of the first packaged integrated circuit, and a signal input terminal for receiving the signal from the output terminal.

8. The semiconductor device structure according to claim 7, wherein the first packaged integrated circuit further comprises:

a power source voltage supplying unit which supplies power to the oscillating unit; and a power source switching unit which supplies power from the power source voltage supplying unit to the oscillating unit and to the multiplying unit when the power source voltage supplying unit supplies power, and which supplies power from the power source input terminal to the oscillating unit and the multiplying unit when the power source voltage supplying unit does not supply power.

* * * * *